(12) United States Patent
Huang et al.

(10) Patent No.: US 11,875,841 B2
(45) Date of Patent: Jan. 16, 2024

(54) MEMORY DEVICE WITH HIGH DATA BANDWIDTH

(71) Applicant: Powerchip Semiconductor Manufacturing Corporation, Hsinchu (TW)

(72) Inventors: Chong-Jen Huang, Taipei (TW); Chun-Cheng Chen, Changhua County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 174 days.

(21) Appl. No.: 17/577,401

(22) Filed: Jan. 18, 2022

(65) Prior Publication Data

US 2023/0186972 A1 Jun. 15, 2023

(30) Foreign Application Priority Data

Dec. 9, 2021 (TW) .................................. 110146139

(51) Int. Cl.
*G11C 7/12* (2006.01)
*G11C 11/4091* (2006.01)
*G11C 11/4094* (2006.01)
*G11C 11/4074* (2006.01)
*G11C 11/4099* (2006.01)
*G11C 11/408* (2006.01)

(52) U.S. Cl.
CPC ...... *G11C 11/4091* (2013.01); *G11C 11/4074* (2013.01); *G11C 11/4085* (2013.01); *G11C 11/4094* (2013.01); *G11C 11/4099* (2013.01)

(58) Field of Classification Search
CPC ............ G11C 11/4091; G11C 11/4074; G11C 11/4085; G11C 11/4094
See application file for complete search history.

(56) References Cited

U.S. PATENT DOCUMENTS

| 11,056,179 | B2   | 7/2021  | Zhao et al. |            |
|------------|------|---------|-------------|------------|
| 11,069,385 | B1 * | 7/2021  | Li          | G11C 11/404 |
| 11,074,964 | B1 * | 7/2021  | Kawamura    | G11C 11/4094 |
| 11,152,056 | B1 * | 10/2021 | Seo         | G11C 11/2273 |

(Continued)

FOREIGN PATENT DOCUMENTS

| CN | 103052946 | 4/2013 |
|----|-----------|--------|
| CN | 113096699 | 7/2021 |

(Continued)

OTHER PUBLICATIONS

"Notice of allowance of Taiwan Counterpart Application", dated Nov. 9, 2022, p. 1-p. 4.

*Primary Examiner* — Mushfique Siddique
(74) *Attorney, Agent, or Firm* — JCIPRNET

(57) ABSTRACT

A memory device is provided. The memory device includes at least one memory chip and a logic chip. Each of the at least one memory chip includes a memory array, a plurality of bit lines, and a plurality of data paths. The data paths respectively correspond to the bit lines. The number of the data paths is equal to or less than the number of the bit lines. A plurality of data transmission ports of the logic chip are electrically connected to the data paths of the at least one memory chip in a one-to-one manner. The number of the data transmission ports is equal to a sum of the data paths of the at least one memory chip.

17 Claims, 5 Drawing Sheets

(56) References Cited

U.S. PATENT DOCUMENTS

| | | | |
|---|---|---|---|
| 2011/0286254 A1* | 11/2011 | Yu | G11C 7/222 |
| | | | 365/51 |
| 2015/0286762 A1 | 10/2015 | Sato et al. | |
| 2018/0012867 A1* | 1/2018 | Kim | H01L 25/18 |
| 2018/0053545 A1 | 2/2018 | Son | |
| 2020/0051613 A1* | 2/2020 | Derner | G11C 5/025 |
| 2023/0094148 A1* | 3/2023 | Lee | G06F 3/0604 |
| | | | 711/105 |

FOREIGN PATENT DOCUMENTS

| | | |
|---|---|---|
| TW | 201250682 | 12/2012 |
| TW | I598876 | 9/2017 |
| TW | 201933107 | 8/2019 |
| TW | 202141512 | 11/2021 |

\* cited by examiner

MEMORY DEVICE WITH HIGH DATA BANDWIDTH

CROSS-REFERENCE TO RELATED APPLICATION

This application claims the priority benefit of Taiwan application serial no. 110146139, filed on Dec. 9, 2021. The entirety of the above-mentioned patent application is hereby incorporated by reference herein and made a part of this specification.

BACKGROUND

Technical Field

The disclosure relates to a memory device; more particularly, the disclosure relates to a memory device capable of accessing data with high data bandwidth.

Description of Related Art

In an existing memory device, a logic chip accesses data on at least one memory chip. However, data access should go through certain processes, such as addressing, data input/output buffering, and so on. Therefore, if it is intended to further improve the performance of the memory device, said addressing process and said data input/output buffering process inevitably limit the performance improvement of a high-speed memory device.

SUMMARY

The disclosure provides a memory device capable of accessing data with high data bandwidth.

According to an embodiment of the disclosure, a memory device including at least one memory chip and a logic chip is provided. Each of the at least one memory chip includes a memory array, a plurality of bit lines, and a plurality of data paths. The bit lines are coupled to the memory array. The data paths respectively correspond to the bit lines. The number of the data paths is equal to or less than the number of the bit lines. The logic chip includes a plurality of data transmission ports, and the data transmission ports are electrically connected to the data paths of the at least one memory chip in a one-to-one manner. The number of the data transmission ports is equal to a sum of the data paths of the at least one memory chip. The logic chip reads a plurality of data from the at least one memory chip through the data transmission ports.

According to another embodiment of the disclosure, a memory device including at least one memory chip and a logic chip is provided. Each of the at least one memory chip includes a substrate, a memory array, a plurality of bit lines, and a plurality of data paths. The memory array is disposed on the substrate. The bit lines are disposed on the substrate and coupled to the memory array. The data paths are disposed on the substrate and correspond to the bit lines, respectively. The number of the data paths is equal to or less than the number of the bit lines. The logic chip includes a plurality of data transmission ports. The number of the data transmission ports is equal to a sum of the data paths of the at least one memory chip. At least parts of the data paths respectively pass through the substrate and are connected to the data transmission ports in a one-to-one manner.

In light of the above, the data transmission ports are electrically connected to the data paths of the at least one memory chip in a one-to-one manner, and the number of the data transmission ports is equal to a sum of the data paths of the at least one memory chip. Hence, the logic chip may at least read the data from all of the data paths in a one-time manner. Thereby, the memory device may have a high data access bandwidth.

To make the aforementioned more comprehensible, several embodiments accompanied with drawings are described in detail as follows.

BRIEF DESCRIPTION OF THE DRAWINGS

The accompanying drawings are included to provide a further understanding of the disclosure and are incorporated in and constitute a part of this specification. The drawings illustrate embodiments of the disclosure and, together with the description, serve to explain the principles of the disclosure.

DESCRIPTION OF THE EMBODIMENTS

Figure 1:
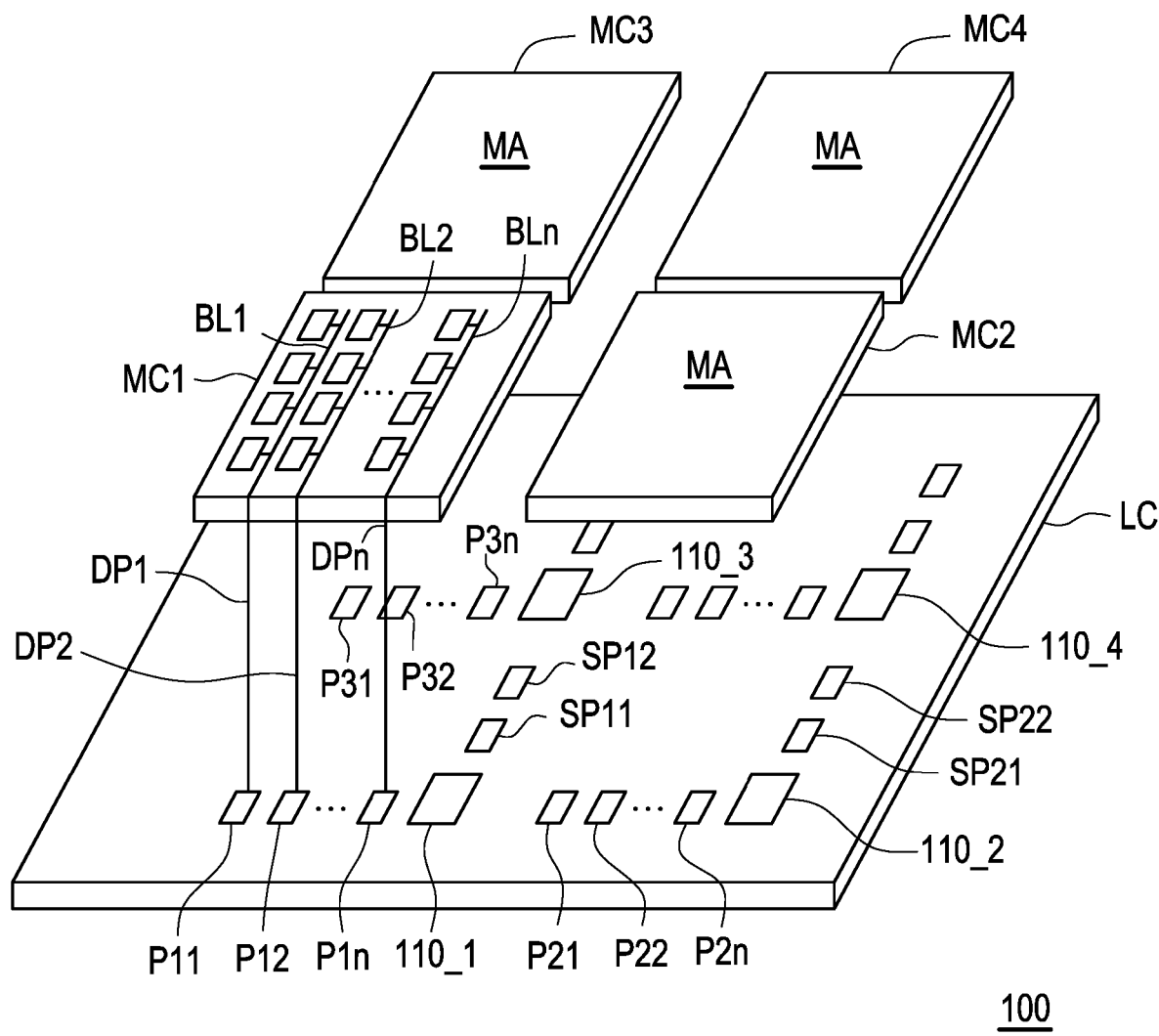
FIG. 1 is a schematic view of a memory device according to a first embodiment of the disclosure.

Reference will now be made in detail to the exemplary embodiments of the disclosure, examples of which are illustrated in the accompanying drawings. Whenever possible, the same reference numerals are used to represent the same drawings or similar parts in the accompanying and description, and the description of the same technical content is omitted. The description of the omitted part may be derived from the previous embodiment and will not be repeated in the following embodiments.

The formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

FIG. 1 is a schematic view of a memory device according to a first embodiment of the disclosure. As shown in FIG. 1, a memory device 100 provided in this embodiment includes memory chips MC1-MC4 and a logic chip LC. Each of the memory chips MC1-MC4 includes a memory array MA, a plurality of bit lines, and a plurality of data paths. For instance, the memory chip MC1 includes the memory array MA, bit lines BL1-BLn, and data paths DP1-DPn. The bit lines BL1-BLn are coupled to the memory array MA. Specifically, the bit line BL1 is coupled to a first column of memory cells in the memory array MA, the bit line BL2 is coupled to a second column of memory cells in the memory array, and the rest may be deduced therefrom. In the present embodiment, the data paths DP1-DPn respectively correspond to the bit lines BL1-BLn. The data path DP1 corresponds to the bit line BL1, the data path DP2 corresponds to the bit line BL2, and the rest may be deduced therefrom. That is, each of the bit lines BL1-BLn exclusively corresponds to one of the data paths DP1-DPn. The number of the data paths DP1-DPn is equal to the number of the bit lines BL1-BLn. Hence, in the memory device 100, the sum of the data paths is equal to the sum of the bit lines of the memory chips MC1-MC4. For instance, each of the memory chips MC1-MC4 respectively includes 16 bit lines (which should however not be construed as a limitation in the disclosure). The sum of the bit lines is 64, and thus the sum of the data paths is 64. In some embodiments, at least one of the data paths DP1-DPn corresponds to a plurality of bit lies, and the number of the data paths DP1-DPn is less than the number of the bit lines BL1-BLn. As such, in the memory device, the sum of the data paths is less than the sum of the bit lines of the memory chips MC1-MC4.

In this embodiment, the logic chip LC includes data transmission ports P11-P1n, P21-P2n, P31-P3n, and P41-P4n. The data transmission ports P11-P1n, P21-P2n, P31-P3n, and P41-P4n are electrically connected to the data paths of the memory chips MC1-MC4 in a one-to-one manner. For instance, in the exemplary memory chip MC1, the data path DP1 is directly electrically connected to the data transmission port P11, the data path DP2 is directly electrically connected to the data transmission port P12, and the rest may be deduced therefrom. Hence, the number of the data transmission ports P11-P1n, P21-P2n, P31-P3n, and P41-P4n is equal to the sum of the data paths of the memory chips MC1-MC4.

In this embodiment, the logic chip LC reads a plurality of data from the memory chips MC1-MC4 through the data transmission ports P11-P1n, P21-P2n, P31-P3n, and P41-P4n. For instance, the memory chips MC1-MC4 respectively include 16 bit lines (which should not be construed as a limitation in the disclosure). The sum of the bit lines is 64. Therefore, n is equal to 16 (which should not be construed as a limitation in the disclosure). The logic chip LC may read 64 bits of data once. In comparison with the existing memory device, note that there is no buffer (e.g., a latch, a data selection circuit, a first-in-first-out buffer, etc.) between the logic chip LC and the memory chips MC1-MC4 in the memory device 100 provided in this embodiment. As such, the memory device 100 may have a high data reading bandwidth and a high data transmission speed. In this embodiment, the logic chip LC may also provide 64 bits of data once to the memory chips MC1-MC4. As such, the memory device 100 may also have a high data write-in bandwidth.

In addition, there is no buffer between the logic chip LC and the memory chips MC1-MC4 in the memory device 100. Hence, power consumption of the memory device 100 may be reduced.

For clear explanations, 4 memory chips MC1-MC4 are taken as an example in this embodiment. According to actual needs, the number of the memory chips may be one or more and should not be limited to what is provided in this embodiment. In addition, the number of the bit lines of the memory chips MC1-MC4 may be the same, not completely the same, or completely different, which should not be construed as a limitation in the disclosure.

In this embodiment, the number of the memory chips MC1-MC4 may be more than one. The logic chip LC includes memory controllers 110_1-110_4. The memory controllers 110_1-110_4 are respectively coupled to a corresponding memory chip of the memory chips MC1-MC4. The memory controllers 110_1-110_4 respectively control the corresponding memory chip in response to an operating command. Hence, the memory chips MC1-MC4 respectively provide a plurality of operating voltages corresponding to the operating command to a plurality of word lines (not shown). The operating command may be a command associated with a programming operation, a readout operation, and a refreshing operation. In this embodiment, the memory controller 110_1 controls the memory chip MC1 through signal transmission ports SP11 and SP12, the memory controller 110_2 controls the memory chip MC2 through signal transmission ports SP21 and SP22, and the rest may be deduced therefrom.

Note that the memory controllers 110_1-110_4 are disposed at the logic chip LC instead of being disposed at the memory chips MC1-MC4. Hence, an area occupied by the memory chips MC1-MC4 may be reduced. Thereby, the logic chip LC may accommodate more memory chips to further increase the access bandwidth.

Figure 2:
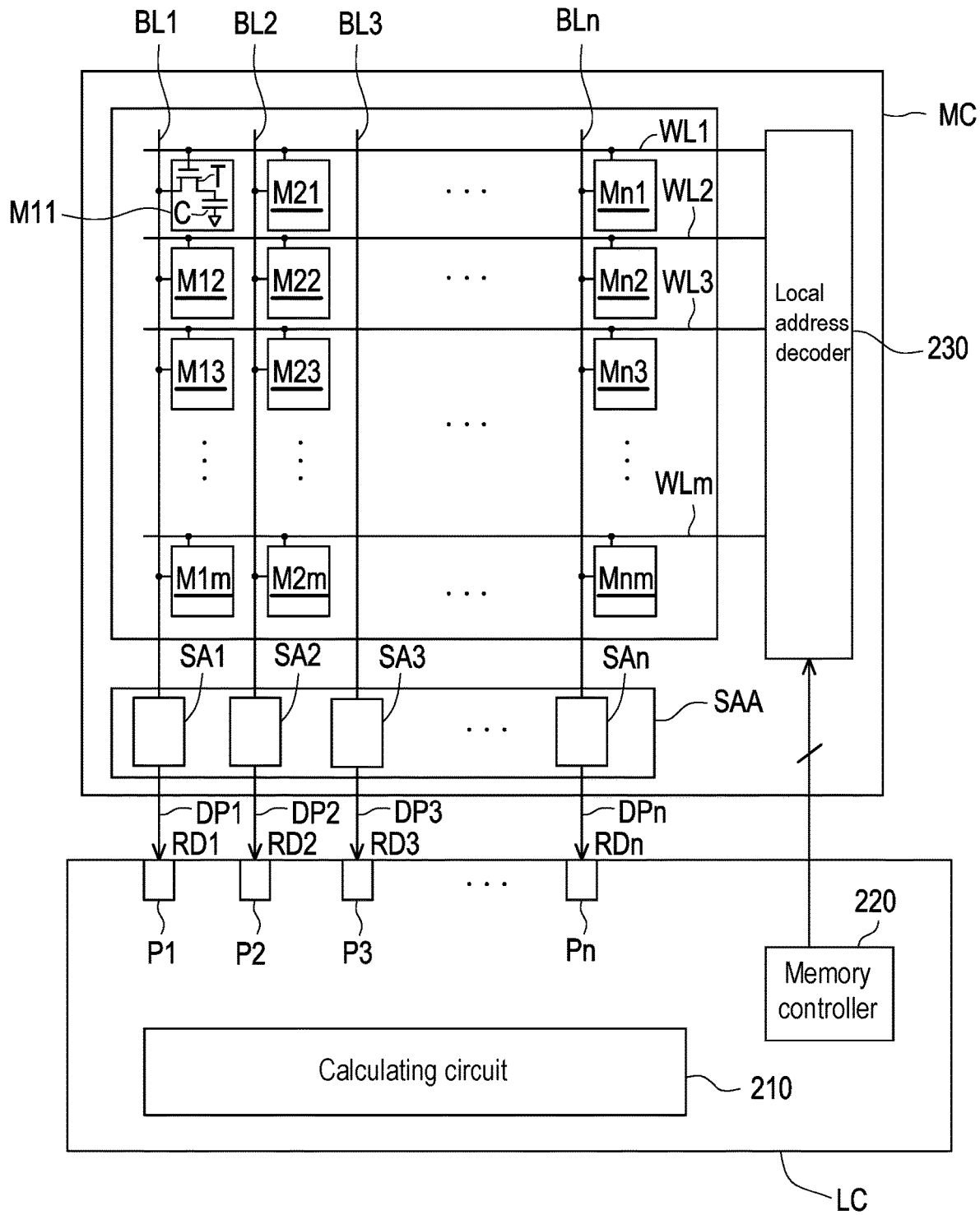
FIG. 2 is a schematic view of a memory device according to a second embodiment of the disclosure.

FIG. 2 is a schematic view of a memory device according to a second embodiment of the disclosure. As shown in FIG. 2, a memory device 200 provided in this embodiment includes a memory chip MC and the logic chip LC. The memory chip MC includes the memory array MA, the bit lines BL1-BLn, word lines WL1-WLm, the data paths DP1-DPn, and a sensing amplifier array SAA. The sensing amplifier array SAA includes sensing amplifiers SA1-SAn. The sensing amplifiers SA1-SAn perform a gain process on data (or readout data) RD1-RDn in the corresponding bit line of the bit lines BL1-BLn, respectively, and provide the gained data RD1-RDn to a corresponding data path of the data paths DP1-DPn. For instance, in the present embodiment, the sensing amplifier SA1 performs a gain process on the data RD1 in the bit line BL1 and provides the gained data RD1 to the data path DP1, the sensing amplifier SA2 performs a gain process on the data RD2 in the bit line BL2 and provides the gained data RD2 to the data path DP2, and the rest may be deduced therefrom. In the memory chip MC, the number of the sensing amplifiers SA1-SAn is equal to the number of the bit lines BL1-BLn.

The logic chip LC includes data transmission ports P1-Pn, a calculating circuit 210, and a memory controller 220. The logic chip LC receives the gained data RD1-RDn through the data transmission ports P1-Pn. The calculating circuit 210 performs a calculation on at least one of the data RD1-RDn. The memory controller 220 controls the memory chip MC in response to the operating command. The operating command further includes an addressing message. The memory controller 220 controls the memory chip MC according to the addressing message of the operating command.

In this embodiment, the memory chip MC includes a local address decoder 230. The local address decoder 230 provides a plurality of operating voltages corresponding to the operating command to the word lines WL1-WLm based on the addressing message of the operating command.

In this embodiment, the memory array MA is a dynamic random access memory (DRAM) array. The memory array MA includes DRAM cells M11-Mnm. The DRAM cells M11-M1m are the first column of memory cells, the DRAM cells M21-M2m are the second column of memory cells, and the rest may be deduced therefrom. The DRAM cells M11-Mn1 are the first row of memory cells, the DRAM cells M12-Mn2 are the second row of memory cells, and the rest may be deduced therefrom.

For instance, the exemplary DRAM cell M11 includes a transistor T and a capacitor C. A control terminal of the transistor T is coupled to the word line WL1. A first terminal of the transistor T is coupled to the bit line BL1. The capacitor C is coupled between a second terminal of the transistor T and a low reference voltage.

Figure 3:
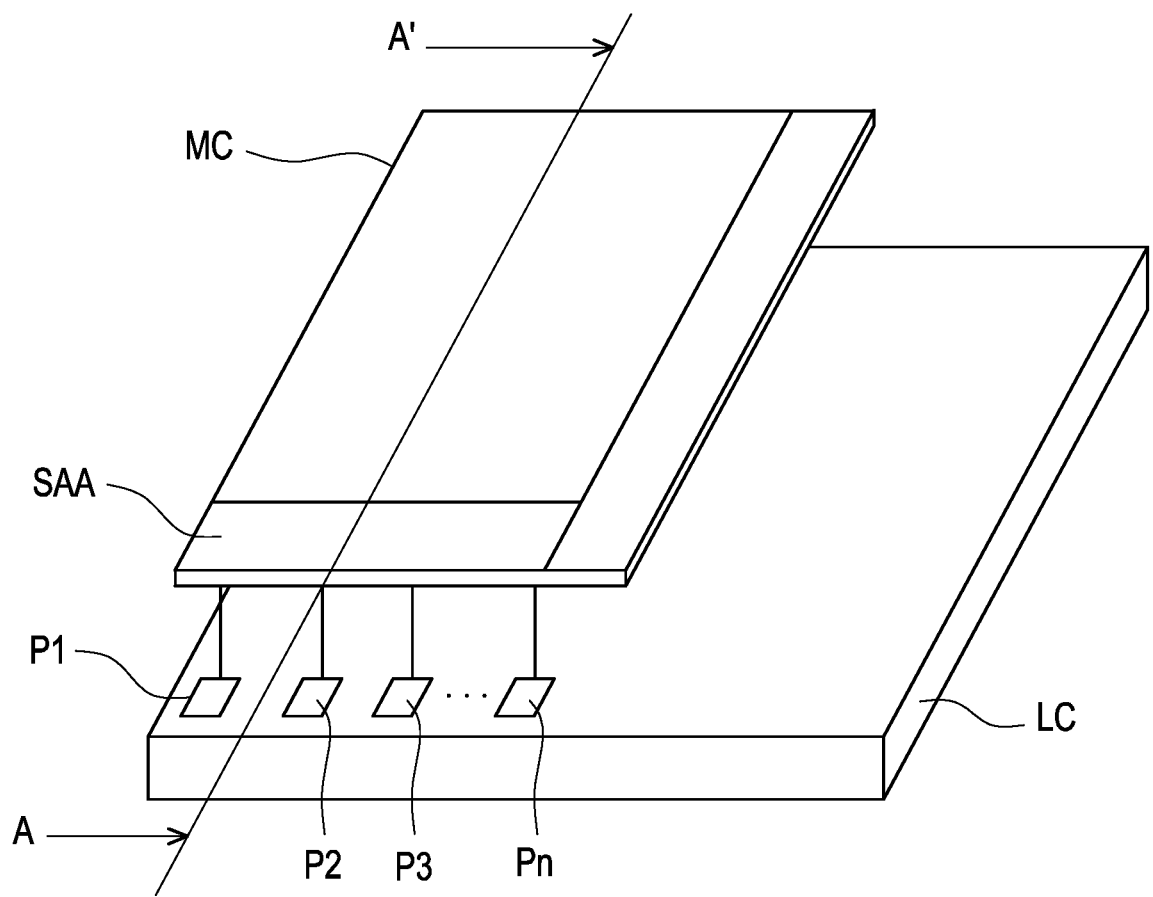
FIG. 3 is a schematic partial view of a memory device according to a third embodiment of the disclosure.
Figure 4:
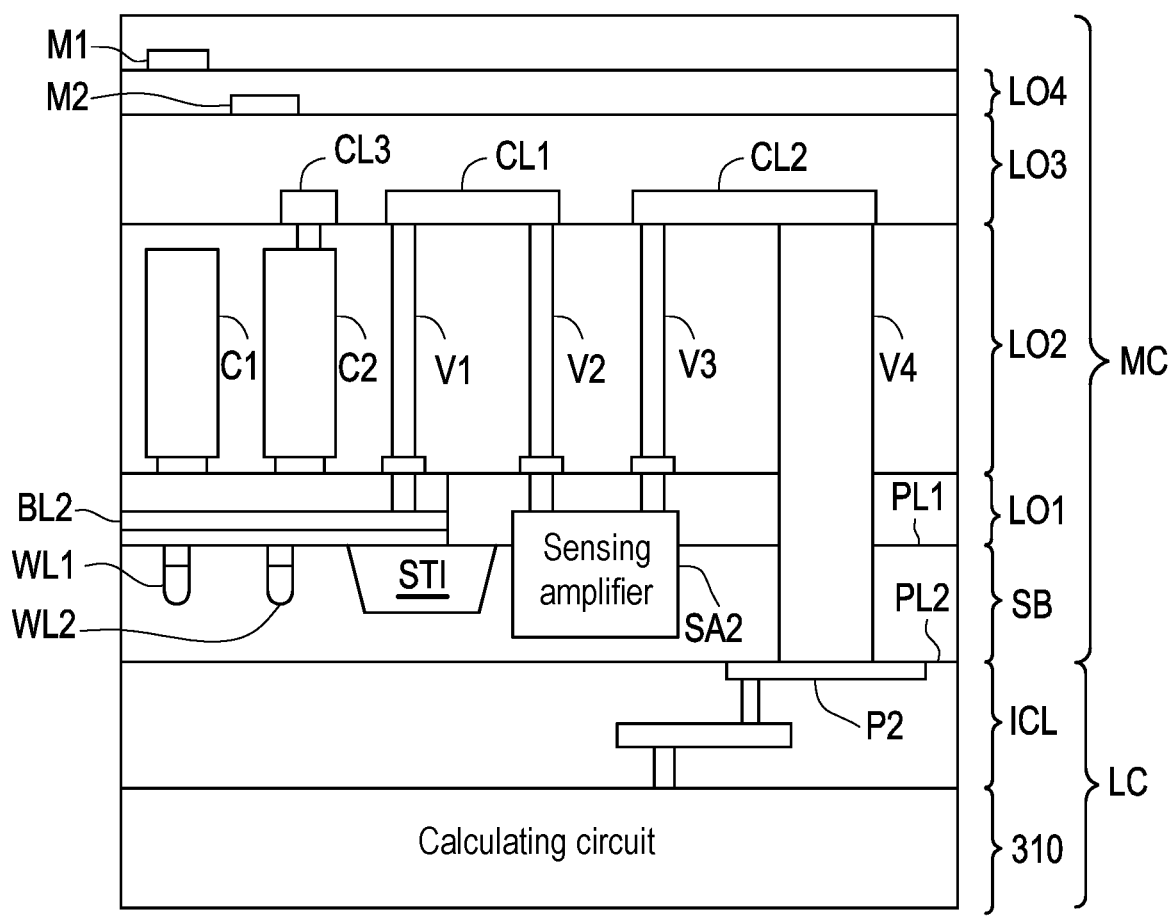
FIG. 4 is a schematic view of one portion of an A-A' section of the memory device according to the third embodiment of the disclosure.

Please refer to FIG. 3 and FIG. 4 at the same time. FIG. 3 is a schematic partial view of a memory device according to a third embodiment of the disclosure. FIG. 4 is a schematic view of one portion of an A-A' section of the memory device according to the third embodiment of the disclosure. In this embodiment, the A-A' section is a sectional view obtained by sectioning along an extension plane of the bit line BL2 and the data path DP2. On the A-A' section, the memory chip MC structurally includes a substrate SB and inter-layer insulation layers LO1-LO3. The inter-layer insulation layer LO1 at least covers a first surface PL1 of the substrate SB and the transistor of the DRAM cell. The word lines are embedded in the substrate SB (only the word lines WL1 and WL2 are shown in FIG. 4). The first inter-layer insulation layer LO1 further covers the sensing amplifier (only the sensing amplifier SA2 is shown in FIG. 4). The inter-layer insulation layer LO2 at least covers the inter-layer insulation layer LO1. Similarly, the inter-layer insulation layer LO3 at least covers the inter-layer insulation layer LO2.

In this embodiment, the bit line is disposed in the inter-layer insulation layer LO1 (only the bit line BL2 is shown in FIG. 4). The bit line BL2 is connected to an input terminal of the sensing amplifier SA2 via a connection path CNP2. An output terminal of the sensing amplifier SA2 is connected to a second surface PL2 of the substrate SB via the data path DP2. The memory chip MC contacts the logic chip LC through the second surface PL2 of the substrate SB.

Particularly, the connection path CNP2 includes through holes V1 and V2 and a connection wire CL1. The through hole V1, the connection wire CL1, and the through hole V2 are serially coupled between the bit line BL2 and the input terminal of the sensing amplifier SA2. A first terminal of the through hole V1 is coupled to the bit line BL2. A first terminal of the connection wire CL1 is coupled to a second terminal of the through hole V1. The through hole V2 is coupled between a second terminal of the connection wire CL1 and the input terminal of the sensing amplifier SA2. In this embodiment, the connection wire CL1 is disposed on the inter-layer insulation layer LO2. In addition, the connection wire CL1 is covered by the inter-layer insulation layer LO3.

At least parts of the data paths respectively pass through the substrate SB and are connected to corresponding data transmission ports in a one-to-one manner. In this embodiment, the data path DP2 includes through holes V3 and V4 and the connection wire CL2. The through hole V3, the connection wire CL2, and the through hole V4 are serially coupled between the output terminal of the sensing amplifier SA2 and the second surface PL2 of the substrate SB. A first terminal of the through hole V3 is coupled to the output terminal of the sensing amplifier SA2. A first terminal of the connection wire CL2 is coupled to a second terminal of the through hole V3. The through hole V4 is coupled between a second terminal of the connection wire CL2 and the second surface PL2 of the substrate SB. In other words, the through hole V4 passes through the substrate SB and is connected to the data transmission port P2. The data path DP2 need not bypass an edge of the substrate SB. Hence, the length of the data path DP2 is reduced. In this embodiment, the connection wire CL2 is disposed on the inter-layer insulation layer LO2. Therefore, the connection wires CL1 and CL2 may be conductive patterns on the inter-layer insulation layer LO2.

In addition, the connection wire CL2 is also covered by the inter-layer insulation layer LO3.

In this embodiment, the capacitors of the DRAM cells are embedded in the inter-layer insulation layer LO2 (only the capacitors C1 and C2 are shown in FIG. 4). For instance, each of the capacitors C1 and C2 has a metal-insulator-metal (MIM) stacked structure, respectively. A first terminal of the capacitor C1 is coupled to a first transistor. The capacitor C1 and the first transistor together constitute a first DRAM cell. A first terminal of the capacitor C2 is coupled to a second transistor. The capacitor C2 and the second transistor together constitute a second DRAM cell. A second terminal of the capacitor C1 and a second terminal of capacitor C2 are coupled to the low reference voltage via a connection wire CL3. Hence, the connection wires CL1-CL3 may be conductive patterns on the inter-layer insulation layer LO2.

In this embodiment, the logic chip LC includes a calculating circuit 310, an interconnection layer ICL, and the data transmission ports (only the data transmission port P2 is shown in FIG. 4). The interconnection layer ICL is coupled to the calculating circuit 310 and the data transmission port P2. The interconnection layer ICL receives data through the data transmission port P2 and transmits the data to the calculating circuit 310. In this embodiment, the memory chip MC is stacked on the logic chip LC. The second surface PL2 of the substrate SB of the memory chip MC is in contact with the interconnection layer ICL. Thereby, the through hole V4 of the data path DP2 is electrically connected to the data transmission port P2.

In this embodiment, the memory chip MC structurally includes an inter-layer insulation layer LO4 and metal connection lines M1 and M2. The inter-layer insulation layer LO4 at least covers the inter-layer insulation layer LO3. The metal connection lines M1 and M2 respectively transmit the operating voltages or provide the operating voltages to the corresponding word lines. For instance, the metal connection line M2 is connected to the word line WL2 through a through hole (not shown).

The metal connection lines M1 and M2 are respectively disposed on one of the inter-layer insulation layers LO3 and LO4. For instance, according to this embodiment, the metal connection line M1 is disposed on the inter-layer insulation layer LO4, and the metal connection line M2 is disposed on the inter-layer insulation layer LO3, which should however not be construed as limitations in the disclosure. In some embodiments, the metal connection lines M1 and M2 are respectively disposed on the inter-layer insulation layer LO3. In some embodiments, the metal connection lines M1 and M2 are respectively disposed on the inter-layer insulation layer LO4. In some embodiments, the metal connection line M1 is disposed on the inter-layer insulation layer LO3, and the metal connection line M2 is disposed on the inter-layer insulation layer LO4.

Generally, the metal connection lines M1 and M2 and the word lines WL1 and WL2 may transmit relatively high operating voltages, e.g., 2.6-3.0 volts. In this embodiment, note that the metal connection lines M1 and M2 are respectively disposed on one of the inter-layer insulation layers LO3 and LO4. The connection path CNP2 and the data path DP2 are covered by the inter-layer insulation layer LO2. The data from the bit line BL2 may be provided to the second surface PL2 of the substrate SB through the connection path CNP2, the sensing amplifier SA2, and the data path DP2. The logic chip LC contacts the second surface PL2 of the substrate SB through the data transmission port P2. Said paths provide a relatively short data transmission distance and prevent data from being interfered by the relatively high operating voltages of the word lines. A transmission path of the operating voltages and a transmission path of the data in the same inter-layer insulation layer do not intersect with each other. Hence, the memory chip MC need not increase the voltage values of the data paths nor perform a significant gain process on the data to suppress the interference of the relatively high operating voltages of the word lines. As such, power consumption of the memory chip MC can be reduced.

In the substrate SB, a shallow trench isolation (STI) structure is formed between the sensing amplifier SA2 and the word line closest to the sensing amplifier SA2 (e.g., the word line WL2). As such, the operation of the sensing amplifier SA2 is not susceptible to the interference of the operating voltage.

Figure 5:
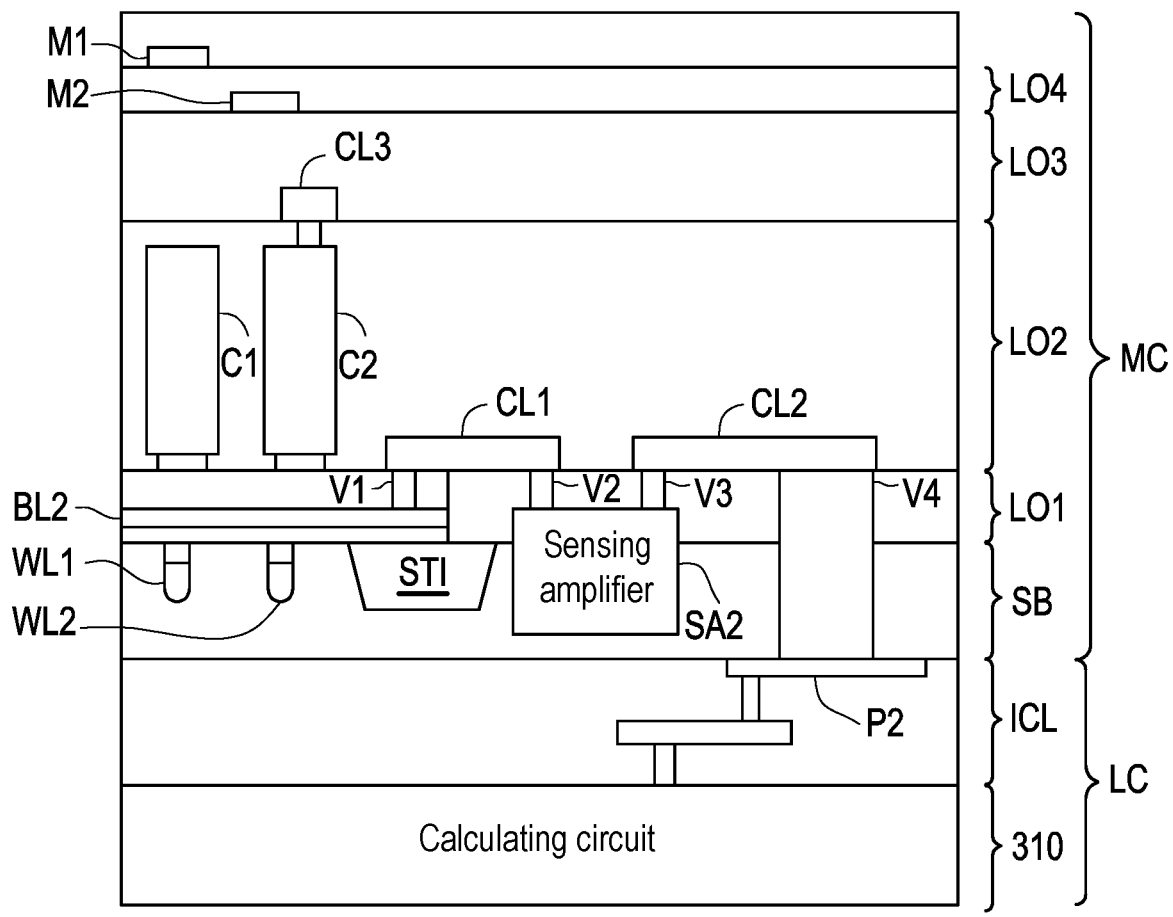
FIG. 5 is a schematic view of the other portion of the A-A' section of the memory device according to the third embodiment of the disclosure.

Please refer to FIG. 3 and FIG. 5 at the same time. FIG. 3 is the schematic partial view of the memory device according to the third embodiment of the disclosure. FIG. 5 is a schematic view of the other portion of the A-A' section of the memory device according to the third embodiment of the disclosure. The connection path CNP2 includes the through holes V1 and V2 and the connection wire CL1. The through hole V1, the connection wire CL1, and the through hole V2 are serially coupled between the bit line BL2 and the input terminal of the sensing amplifier SA2. The data path DP2 includes the through holes V3 and V4 and the connection wire CL2. The through hole V3, the connection wire CL2, and the through hole V4 are serially coupled between the output terminal of the sensing amplifier SA2 and the second surface PL2 of the substrate SB. The difference between FIG. 4 and FIG. 5 lies in that the connection wire CL1 in FIG. 5 is disposed on the inter-layer insulation layer LO1. In addition, the connection wire CL1 is covered by the inter-layer insulation layer LO2. The connection wire CL2 is disposed on the inter-layer insulation layer LO1. In addition, the connection wire CL2 is covered by the inter-layer insulation layer LO2. Hence, the height of the through holes V1 and V2 shown in FIG. 5 is significantly less than the height of the through holes V1 and V2 shown in FIG. 4. As a result, the length of the connection path CNP2 shown in FIG. 5 is reduced. In addition, the height of the through hole V3 shown in FIG. 5 is significantly less than the height of the through hole V3 shown in FIG. 4; the height of the through hole V4 shown in FIG. 5 is significantly less than the height of the through hole V4 shown in FIG. 4. As a result, the length of the data path DP2 shown in FIG. 5 is reduced.

In some embodiments, the connection wire CL1 may be disposed on the inter-layer insulation layer LO2. In some embodiments, the connection wire CL2 may be disposed on the inter-layer insulation layer LO2.

To sum up, the memory device provided in one or more embodiments of the disclosure includes at least one memory chip and the logic chip. Each of the at least one memory chip includes the memory array, the bit lines, and the data paths. The data transmission ports are electrically connected to the data paths of each of the at least one memory chip in a one-to-one manner. The number of the data transmission ports is equal to the sum of the data paths of the at least one memory chip. The logic chip may directly read the data from all of the data paths and directly provide the data to all of the data paths. Thereby, the memory device may at least have a high data reading bandwidth. Besides, the power consumption of the memory device may be reduced. In another aspect, the transmission path of the operating voltages of the word lines and the data transmission path of the bit lines in the same inter-layer insulation layer do not intersect with each other. Hence, the memory chip need not increase the voltage values of the data paths nor perform a significant gain process on the data greatly to suppress the interference of the high operating voltages of the word lines. Thereby, the power consumption of the memory chip can be reduced. In addition, at least one memory controller is disposed at the logic chip instead of being disposed at the memory chip. Thus, the memory capacity may be increased, or the chip area may be reduced. As a result, the logic chip may accommodate more memory chips, so as to further increase the data access bandwidth.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory device, comprising:
   at least one memory chip, each comprising:
      a substrate;
      a memory array, comprising a plurality of dynamic random access memory cells;
      a first inter-layer insulation layer, covering a first surface of the substrate and the transistors of the dynamic random access memory cells;
      a plurality of bit lines, coupled to the memory array; and
      a plurality of data paths, respectively corresponding to the bit lines, wherein the number of the data paths is equal to or less than the number of the bit lines; and
      a sensing amplifier array, comprising a plurality of sensing amplifiers, wherein the bit lines are disposed in the first inter-layer insulation layer, and the bit lines are respectively connected to an input terminal of a corresponding sensing amplifier of the sensing amplifiers via a connection path, wherein the connection path comprises:
         a first through hole, a first terminal of the first through hole being coupled to a corresponding bit line of the bit lines;
         a first connection wire, a first terminal of the first connection wire being coupled to a second terminal of the first through hole; and
         a second through hole, coupled between a second terminal of the first connection wire and the input terminal of the corresponding sensing amplifier; and
   a logic chip, comprising:
      a plurality of data transmission ports, electrically connected to the data path of the at least one memory chip in a one-to-one manner,
   wherein the number of the data transmission ports is equal to a sum of the data paths of the at least one memory chip, and
   the logic chip reads or writes a plurality of data from the at least one memory chip through the data transmission ports.

2. The memory device according to claim 1, wherein each of the at least one memory chip further comprises:
   wherein the sensing amplifiers are respectively configured to perform a gain process on data of the corresponding bit line of the bit lines and provide the gained data to a corresponding data path of the data paths.

3. The memory device according to claim 2, wherein:
   each of the at least one memory chip further comprises a plurality of word lines and each of the dynamic random access memory cells comprises:
a transistor, a control terminal of the transistor being coupled to a corresponding word line of the word lines, a first terminal of the transistor being coupled to the corresponding bit line of the bit lines; and
a capacitor, coupled between a second terminal of the transistor and a low reference voltage.

4. The memory device according to claim 1, wherein the word lines are embedded in the substrate.

5. The memory device according to claim 1, wherein the first inter-layer insulation layer further covers the sensing amplifiers.

6. The memory device according to claim 1, wherein each of the data paths comprises:
a third through hole, a first terminal of the third through hole being coupled to an output terminal of the corresponding sensing amplifier;
a second connection wire, a first terminal of the second connection wire being coupled to a second terminal of the third through hole; and
a fourth through hole, disposed between a second terminal of the second connection wire and a second surface of the substrate,
wherein the second surface contacts the logic chip.

7. The memory device according to claim 1, wherein the first connection wire is disposed on the first inter-layer insulation layer.

8. The memory device according to claim 1, wherein each of the at least one memory chip further comprises:
a second inter-layer insulation layer, at least covering the first inter-layer insulation layer,
wherein the first connection wire is disposed on the second inter-layer insulation layer.

9. The memory device according to claim 1, wherein each of the at least one memory chip further comprises:
a third inter-layer insulation layer, at least covering the second inter-layer insulation layer;
a fourth inter-layer insulation layer, at least covering the third inter-layer insulation layer; and
a plurality of metal connection lines, respectively coupled to the corresponding word line of the word lines and configured to provide a plurality of operating voltages to the word lines,
wherein the metal connection lines are respectively disposed on one of the third inter-layer insulation layer and the fourth inter-layer insulation layer.

10. The memory device according to claim 1, wherein the logic chip comprises:
a calculating circuit, configured to perform a calculation on at least one of the data.

11. The memory device according to claim 10, wherein the logic chip further comprises:
an interconnection layer, coupled to the calculating circuit and the data transmission ports and configured to receive the data through the data transmission ports and transmit the data to the calculating circuit.

12. The memory device according to claim 1, wherein each of the at least one memory chip further comprises a plurality of word lines, wherein the logic chip comprises:
at least one memory controller, respectively coupled to a corresponding memory chip of the at least one memory chip and configured to control the corresponding memory chip in response to an operating command, so that the corresponding memory chip provides a plurality of operating voltages corresponding to the operating command to the word lines, respectively.

13. A memory device, comprising:
at least one memory chip, each comprising:
a substrate;
a memory array, disposed on the substrate;
a plurality of bit lines, disposed on the substrate and coupled to the memory array;
a plurality of data paths, disposed on the substrate and corresponding to the bit lines, respectively, wherein the number of the data paths is equal to or less than the number of the bit lines; and
a sensing amplifier array, comprising a plurality of sensing amplifiers; and
a logic chip, comprising:
a plurality of data transmission ports, wherein the number of the data transmission ports is equal to a sum of the data paths of the at least one memory chip,
wherein at least parts of the data paths respectively pass through the substrate and are connected to the data transmission ports in a one-to-one manner,
wherein each of the data paths comprises:
a first through hole, a first terminal of the first through hole being coupled to an output terminal of a corresponding sensing amplifier of the sensing amplifiers;
a connection wire, a first terminal of the connection wire being coupled to a second terminal of the first through hole; and
a second through hole, disposed between a second terminal of the connection wire and a second surface of the substrate, wherein the second surface contacts the logic chip.

14. The memory device according to claim 13, wherein the sensing amplifiers are respectively configured to perform a gain process on data of a corresponding bit line of the bit lines and provide the gained data to a corresponding data path of the data paths.

15. The memory device according to claim 14, wherein:
each of the at least one memory chip further comprises a plurality of word lines,
the memory array comprises a plurality of dynamic random access memory cells,
and each of the dynamic random access memory cells comprises:
a transistor, a control terminal of the transistor being coupled to the corresponding word line of the word lines, and a first terminal of the transistor being coupled to a corresponding bit line of the bit lines; and
a capacitor, coupled between a second terminal of the transistor and a low reference voltage.

16. The memory device according to claim 15, wherein each of the at least one memory chip further comprises:
a first inter-layer insulation layer, covering a first surface of the substrate and the transistors of the dynamic random access memory cells,
wherein the word lines are embedded in the substrate.

17. The memory device according to claim 16, wherein the first inter-layer insulation layer further covers the sensing amplifiers.

* * * * *